(12) United States Patent
Belic et al.

(10) Patent No.: US 7,638,247 B2
(45) Date of Patent: Dec. 29, 2009

(54) METHOD FOR ELECTRON BEAM PROXIMITY EFFECT CORRECTION

(75) Inventors: Nikola Belic, Munich (DE); Hans Eisenmann, Tutzing (DE)

(73) Assignee: PDF Solutions, Inc., San Jose, CA (US)

( * ) Notice: Subject to any disclaimer, the term of this patent is extended or adjusted under 35 U.S.C. 154(b) by 530 days.

(21) Appl. No.: 11/426,003

(22) Filed: Jun. 22, 2006

(65) Prior Publication Data

US 2008/0067446 A1    Mar. 20, 2008

(51) Int. Cl.
*G03F 1/00*    (2006.01)
*G03C 5/00*    (2006.01)
(52) U.S. Cl. .................. 430/30; 430/296; 430/942; 430/5
(58) Field of Classification Search ............ 250/492.22, 250/491.1, 492.2; 430/30, 296
See application file for complete search history.

(56) References Cited

U.S. PATENT DOCUMENTS

| 4,761,560 | A  | * | 8/1988 | Glendinning | ............ | 250/492.2 |
| 5,863,682 | A  | * | 1/1999 | Abe et al. | ................ | 430/30 |
| 6,107,207 | A  | * | 8/2000 | Waas et al. | ................ | 438/707 |
| 6,281,513 | B1 | * | 8/2001 | Takenaka | .............. | 250/492.22 |
| 2005/0287450 | A1 | * | 12/2005 | Hudek et al. | ................ | 430/30 |

OTHER PUBLICATIONS

S. Manakli, K. Docherty, L. Pain, J. Todeschini, M. Jurdit, B. Icard, S. Leseuil, M. Chomat, B. Minghetti, "New Electron Beam Proximity Effects Correction (EBPC) Approach for 45NM and 32NM Nodes", Japanese Journal of Applied Physics, vol. 45, No. 8A, 2006, pp. 6462-6467.

S. Manakli, C. Soonekindt, L. Pain, J. Todeschini, B. Icard, B. Minghetti, "Complimentary Dose and Geometrical Solutions for EBDW Lithography Proximity Effects Correction—Application for Sub-45NM Nodes Product Manufacturing", "Publicly Presented" (As Opposed to Published), Feb. 22, 2006, Microlithography Conference 2006, San Jose, CA.

* cited by examiner

*Primary Examiner*—Nikita Wells
*Assistant Examiner*—Johnnie L Smith

(57) ABSTRACT

Optimized dose assignments are determined for each portion of a layout by utilizing an improved proximity function and additional dose correction functions in performing a short range proximity effect correction. The optimized dose assignments are determined to minimize critical dimension (CD) deviations and maintain CD linearity across different feature sizes. The improved proximity function and additional dose correction functions are determined by calibration based on experimental CD measurements of test designs. The improved proximity function includes a sum of more than two Gaussian functions, each having an associated effect range and an associated weight, wherein one or more of the associated weights may be negative. The additional dose correction functions include an iso-dense bias correction function and a dose evaluation point displacement function for line end shortening correction. The short range proximity effect correction results are provided as input to a subsequent long range proximity correction.

21 Claims, 8 Drawing Sheets

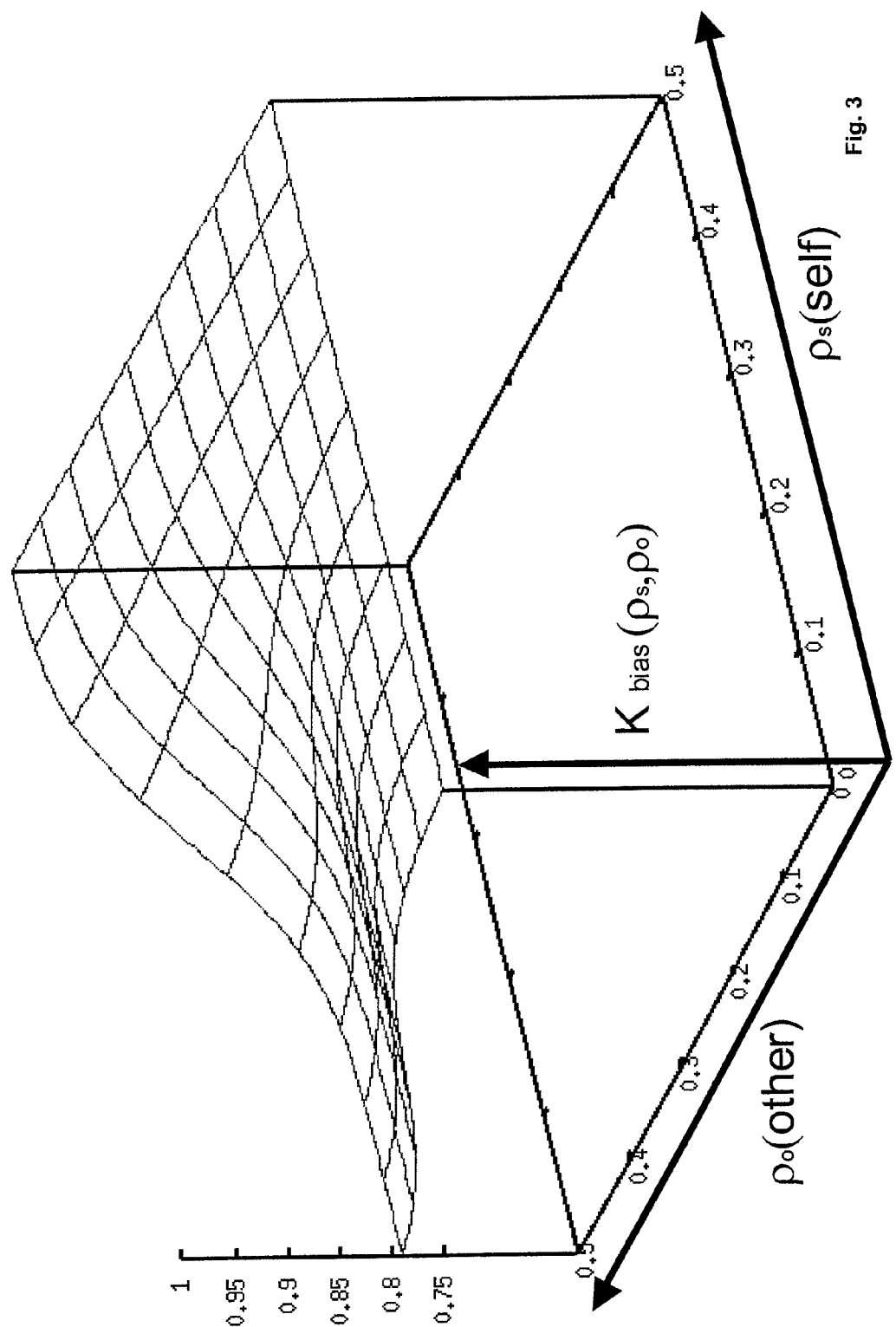

METHOD FOR ELECTRON BEAM PROXIMITY EFFECT CORRECTION

BACKGROUND

In the field of semiconductor fabrication, electron beam lithography provides for increased spatial resolution as compared to light-based lithography. In electron beam lithography, electrons generated by an electron source are accelerated by an electric field and focused by electron optics onto a substrate covered with an electron-sensitive resist coating. In the case of a "positive" electron-sensitive resist coating, exposure of the resist to the focused electrons causes the resist to become soluble in the presence of a developing solution, vice-versa for "negative" resist. Therefore, the electron beam can be used to define layout patterns within the resist. Then, the patterned resist can be used as a stencil for a subsequent semiconductor fabrication process. One electron beam lithography technique involves moving the electron beam relative to the substrate to define the layout patterns within the resist. This technique is referred to as direct write electron beam lithography.

In direct write electron beam lithography, the achievable pattern resolution within the resist is dependent upon how well the spatial electron energy deposition can be controlled within the resist. The electron energy deposition at a given location in the resist includes two components: 1) the electron energy that is deposited at the given location by electrons incident at the given location, and 2) the integral of the electron energy deposited at the given location from electrons incident at other locations within the resist. As the incident electrons traverse through the resist and substrate, the electrons undergo scattering interactions with the resist and substrate such that electron energy is deposited within the resist material as a function of the distance from the initial point of electron beam incidence. The scattering range of the electrons can be significant with respect to the layout pattern feature sizes that are to be defined. Hence, layout pattern features that reside within the electron scattering range from each other can cause electron energy deposition interference. Electron energy deposition interference associated with neighboring layout pattern features is commonly referred to as proximity effect.

To achieve acceptable spatial resolution when defining smaller, e.g., sub-micron, layout pattern features using the direct write electron beam lithography process, it is necessary to adequately predict and correct for proximity effects. To this end, a continuing need exists to improve methods for electron beam proximity effect prediction and correction.

SUMMARY

In one embodiment, a method is disclosed for generating a proximity function and dose correction functions to be used in performing an electron beam proximity effect correction process. The method includes an operation for defining a test design including one or more test structure classes. The test design is rendered in a direct write ebeam process. Critical dimension measurements are performed on the rendered test structures within the test design to enable determination of a target dose function for each test structure class. The method also includes an operation for fitting a proximity function to the target dose function of each test structure class. Using the critical dimension measurements of the test structures, an iso-dense bias dose correction function is developed. Also, using the critical dimension measurements of the test structures, a line end shortening correction function is developed. The method further includes an operation for providing each of the proximity function of a given test structure class, the iso-dense bias dose correction function, and the line end shortening correction function for use in performing a short range effects correction process.

In another embodiment, a method is disclosed for performing an electron beam proximity effect correction process. The method includes an operation for receiving a layout. Based on the received layout, a base proximity function that is suitable for the feature characteristics within the received layout is selected. The method also includes an operation for separating the selected base proximity function into an alpha proximity function and a beta proximity function. The alpha proximity function is used in combination with each of an iso-dense bias correction function and a line end shortening correction function to perform a short range proximity effect correction on the received layout. The method further includes an operation for using results of the short range proximity effect correction and the beta proximity function to perform a long range proximity effect correction on the received layout. The results of both the short range and long range proximity effect corrections are used to formulate a dose value to be assigned to each feature within the received layout.

In another embodiment, a method is disclosed for generating a proximity function to be used in performing an electron beam proximity effect correction process. The method includes an operation for developing a proximity function that includes a sum of more than two Gaussian functions. Each Gaussian function has an associated effect range and an associated weight, wherein at least one of the associated weights is negative. The method also includes an operation for rendering a test structure class on a wafer using a direct write electron beam process. Critical dimensions of features within the rendered test structure class are measured to determine a target dose function for the test structure class. The method further includes an operation for fitting the developed proximity function to the target dose function for the test structure class. The fitting operation generates values for both the effect range and the weight associated with each Gaussian function within the proximity function.

In another embodiment, a method is disclosed for generating an iso-dense bias correction function to be used in performing an electron beam proximity effect correction process. The method includes an operation for rendering both an isolated lines test structure class and a dense lines test structure class on a wafer using a direct write electron beam process. The method also includes an operation for measuring a critical dimension of features within the rendered test structure classes to determine a target dose function for each of the isolated lines test structure class and the dense lines test structure class. The method further includes an operation for developing an iso-dense bias correction multiplier function. Specifically, the iso-dense bias correction multiplier function represents a ratio of the target dose function for the dense lines test structure class to doses computed by proximity correction for the dense lines test structure class using the proximity function derived from the isolated lines test structure class.

Other aspects of the invention will become apparent from the following detailed description, taken in conjunction with the accompanying drawings, illustrating by way of example the principles of the invention.

BRIEF DESCRIPTION OF THE DRAWINGS

FIG. 3 is an illustration showing $k_{bias}$ represented as a three-dimensional function, in accordance with one embodiment of the present invention;

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

It should be appreciated that the present invention can be implemented in numerous ways, including as a process, an apparatus, a system, a device, or a method. Several exemplary embodiments of the invention will now be described in detail with reference to the accompanying drawings.

As acceleration voltages of electron beam (ebeam) mask writing systems increase and feature sizes decrease, proximity effect correction (PEC) techniques need to be adapted accordingly. Higher ebeam voltages increase the backscattering range of electrons, and decreasing feature sizes require a more extensive consideration of short range effects. With an enlarged electron scattering range, the PEC for a given feature should consider the influences of more neighboring features. Additionally, short range effects from neighboring features should be treated in a more detailed manner as the features decrease in size and become more closely spaced.

Figure 1:
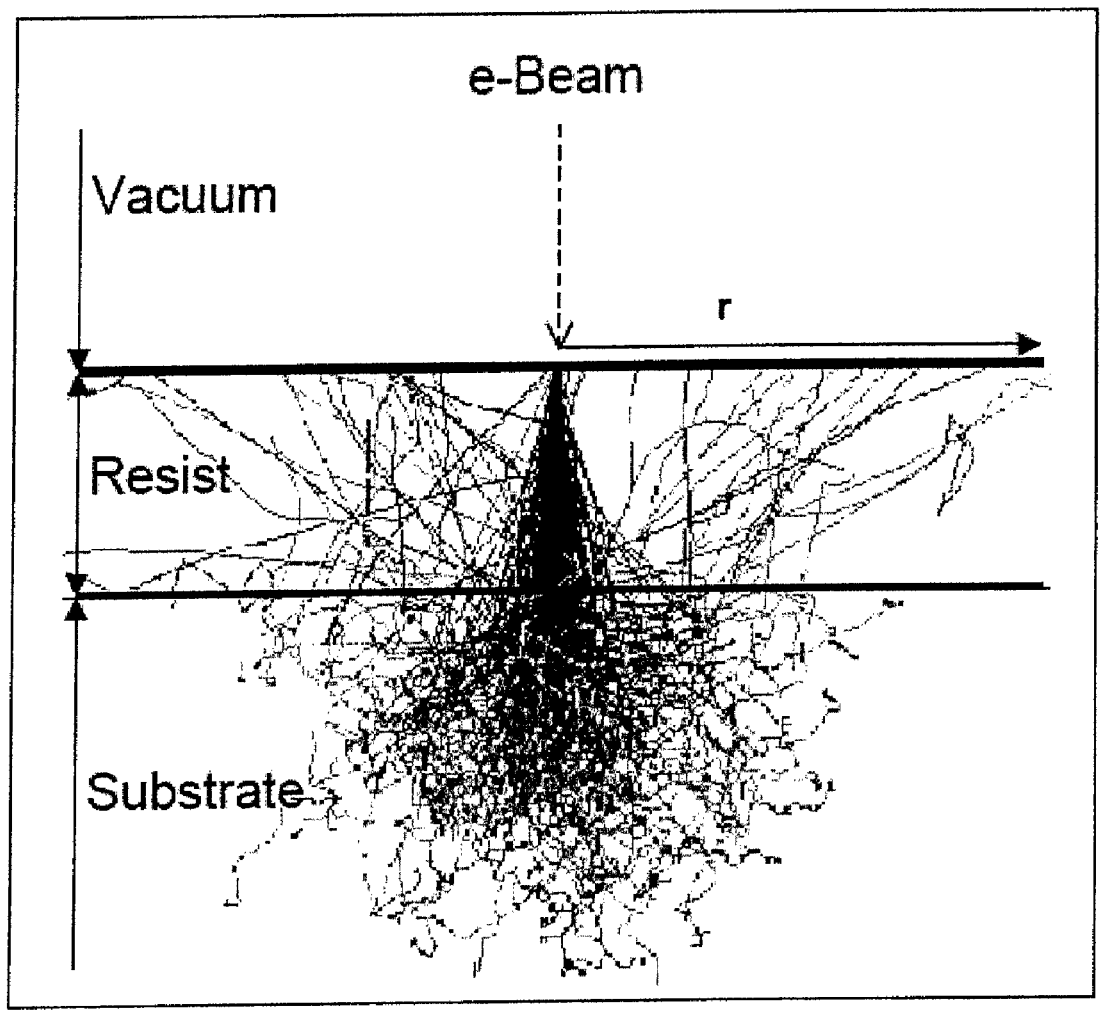
FIG. 1 is an illustration showing an exemplary electron scattering distribution through a resist/substrate material stack due to an incident ebeam.

FIG. 1 is an illustration showing an exemplary electron scattering distribution through a resist/substrate material stack due to an incident ebeam. When electrons hit the material stack, i.e., the resist layer overlying the substrate, they experience many scattering events. These scattering events are divided into two classes: 1) forward scattering and 2) back scattering. Electron forward scattering in the resist enlarges the ebeam and limits the achievable feature resolution. Electron back scattering at the substrate causes electron exposure within the resist at significant distances from the point of ebeam incidence. The electron energy exposure at a particular location within the resist due to forward scattering and back scattering from electrons incident at other locations within the resist is known as the proximity effect.

The contributions to the energy distribution in the resist caused by forward and backward scattering is described by a proximity function. This proximity function is often approximated by the sum of two Gaussian functions as follows:

$$f(r) = \frac{1}{\pi(1+\eta)} \left[ \frac{1}{\alpha^2} \exp\left(-\frac{r^2}{\alpha^2}\right) + \frac{\eta}{\beta^2} \exp\left(-\frac{r^2}{\beta^2}\right) \right] \qquad \text{Equation 1}$$

where $\alpha$ represents the width of the direct exposure, i.e., forward scattering, $\beta$ represents the width of the back scattering, and $\eta$ represents the ratio between exposure from back scattered electrons and direct exposure. Equation 1 is referred to as a proximity function. With reference to FIG. 1, the proximity function is a point-spread function that describes the electron energy deposition influence in the resist at a distance r from the point of electron beam incidence. The electron energy deposition influence described by the proximity function represents the cumulative influence of forward scattered and back scattered electrons as a function of distance from the electron beam point of incidence.

Electron beam proximity correction (EBPC) is used to compensate for dose deviations within the resist caused by electron scattering in the resist. The EBPC process can be performed using software solutions to appropriately modify layout design data to account for proximity effects on one feature resulting from its relative position to other features. The layout design data can be modified either through geometric modification of the feature shapes to be written or by modulating the dose applied to the various features, i.e., dose tag assignment.

Geometric modification for EBPC may be rule-based or model-based. In the rule-based technique, feature geometries are modified based on surrounding feature geometries. As with any rule-based technique, the rules are established based on a finite set of circumstances, i.e., geometry-to-geometry considerations. In reality, there can be no guarantee that an arbitrary layout pattern for a given integrated circuit design is adequately covered by the rules established for geometry-based EBPC. Additionally, because the geometry changes of the various features are interdependent, it should be appreciated that application of the rules for implementing the geometry-based EBPC generally needs to be performed in an iterative manner, which entails a potentially expensive and time consuming process. As with rule-based geometrical correction, model-based geometrical correction also needs to be iterative. It should be appreciated that the process window associated with the geometry-based EBPC methods is inferior to that associated with dose modulation-based EBPC methods. Given the uncertainty and expense associated with geometry-based EBPC, it is desirable to use dose modulation-based EBPC rather than the geometry-based EBPC to achieve the necessary level of feature resolution.

Dose modulation-based EBPC involves calculating an optimized electron exposure dose profile for all feature shapes in the layout. For accurate dose assignment across the layout, the feature shapes may need to be sub-divided. In this case, a dose assignment or dose tag is given to each sub-divided portion of each feature shape. The computation of optimal dose values for each sub-divided portion of a given feature shape in the layout should include the influence of all other portions of the layout within the proximity effect range extending from the given feature shape. The net dose result that matters for a given portion of the layout is the sum of doses delivered to the given portion of the layout by local exposure and by scattering from the neighboring portions of the layout. The dose delivered to a given portion of the layout can be determined by convoluting the layout design with the proximity function as follows, wherein the proximity function describes the radial energy distribution within the resist:

$$\text{Dose}(x,y) = f(r) \otimes \text{Pattern}(x,y) \qquad \text{Equation 2}$$

where $r^2 = x^2 + y^2$, $f(r)$ is the proximity function, and Pattern$(x,y)$ represents the layout features to be patterned in the resist.

To implement the dose modulation-based EBPC, the proximity function needs to be calibrated to the particular ebeam characteristics, resist material, substrate material, and resist development process. Calibration of the proximity function can be done through either electron transport simulation or by a fitting the proximity function to a target dose function derived from experimental measurements of electron exposure within test structures. One advantage of the target dose function method is that the impact of process effects (e.g., resist development effects) is included in the calibration. Once defined and calibrated, the proximity function can be utilized in performing the dose modulation-based EBPC.

In one embodiment of the present invention a method is provided for determining optimized dose assignments for each portion of a layout, such that the layout can be accurately transferred to the resist. The optimized dose assignments are determined such that critical dimension (CD) deviations are minimized and CD linearity is maintained between different feature sizes. The method considers that for accurate dose assignment at feature sizes below about 65 nm, additional process effects should be considered. These additional effects include short range effects that are not covered in the linear model based on local pattern densities, as implemented in common EBPC algorithms, e.g., in EBPC algorithms based on the two-Gaussian proximity function.

In one embodiment of the present invention, an improved proximity function and additional dose correction functions are applied during the calculation of short range electron transport effects. The improved proximity function and additional dose correction functions can be analytical or point-wise, and can be implemented automatically in EBPC software. The improved proximity function and additional dose correction functions are determined by calibration based on experimental CD measurements of test designs, as provided in one embodiment of the present invention. The additional dose correction functions calculate additional dose correction factors that are suitable for combination with the improved proximity function in performing EBPC to obtain a common dose assignment for a given layout portion that considers all relevant short-range and long-range effects. Thus, the improved proximity function and additional dose correction functions provide for simulation and correction of the short-range and long-range proximity effects.

The improved proximity function and additional dose correction functions are described below. Then, a method is described for developing and performing a testing program to calibrate the improved proximity function and additional dose correction functions. Then, a method is described for utilizing the improved proximity function and additional dose correction functions in performing the EBPC process.

Improved Proximity Function

As previously discussed, the proximity function is a point-spread function that describes the electron energy deposition influence in the resist at a distance r from the point of electron beam incidence. The electron energy deposition influence described by the proximity function represents the cumulative influence of forward scattered and back scattered electrons as a function of distance from the electron beam point of incidence.

As presented in Equation 1, the proximity function may be defined as a sum of two Gaussian functions. However, in considering the resolution of exposed features having CD values less than about 65 nm, it becomes apparent that the two-Gaussian proximity function is not sufficient to accurately model the short range electron transport effects, i.e., the short range dose effects. As feature sizes decrease below about 65 nm, the inaccuracy of the two-Gaussian proximity function for handling short range effects manifests itself as a deviation in CD linearity.

In this context, CD linearity is defined as the correlation between measured CD and design CD. For example, an ideal CD linearity corresponds to a one-to-one relationship between measured CD and design CD. In other words, the measured CD is equivalent to the design CD at various design CD values. In reality, an offset exists between the ideal measured-to-design CD relationship and the actual measured-to-design CD relationship. However, if this offset is constant over the range of CD values of concern, the actual measured-to-design CD relationship will exhibit a linear behavior as a function of CD size. It should be appreciated that maintaining CD linearity over the range of CD values within a given layout enables sufficiently accurate rendering of the various feature sizes within the given layout.

The two-Gaussian proximity function allows for variations in the forward scattering range ($\alpha$), variations in the back scattering range ($\beta$), and variations in the forward-to-back scattering exposure ratio ($\eta$). With changes in $\alpha$, the two-Gaussian proximity function exhibits a common dose assignment behavior, i.e., about 1/x dose increase as CD value decreases. For example, use of lower $\alpha$ values will delay the dose increase toward lower CD values, but the eventual dose increase will exhibit about 1/x behavior. To accurately represent short range effects at CD values less than about 65 nm, the proximity function should extend beyond the 1/x modeling capability. The improved proximity function of the present invention provides such an extension beyond the 1/x modeling capability.

Equation 3, as follows, shows a general form of the improved proximity function, in accordance with one embodiment of the present invention:

$$f(r) = \frac{1}{\pi \sum_{i=1}^{n} k_i} \sum_{i=1}^{n} \frac{k_i}{\sigma_i^2} \exp\left(-\frac{r^2}{\sigma_i^2}\right) \qquad \text{Equation 3}$$

where ($\sigma_i$) represents an effect range for a corresponding Gaussian (i), ($k_i$) represents a weight (relative contribution) of a corresponding Gaussian (i), (n) is the number of Gaussian functions used, and (r) is the radial distance from the point of ebeam incidence. In the improved proximity function, each weight ($k_i$) is allowed to have a negative value as necessary to accurately model the measured target dose functions. For example, to accurately account for short range effects at CD values less than about 65 nm, it may be necessary to use more than two Gaussian functions, i.e., (n>2), and it may be necessary to assign a negative weight ($k_i$) to one or more of the Gaussian functions. It should be understood that the improved proximity function can also be defined as a point-wise function that allows for local minima, whereas conventional proximity functions are expected to be monotonically decreasing.

Figure 2A:
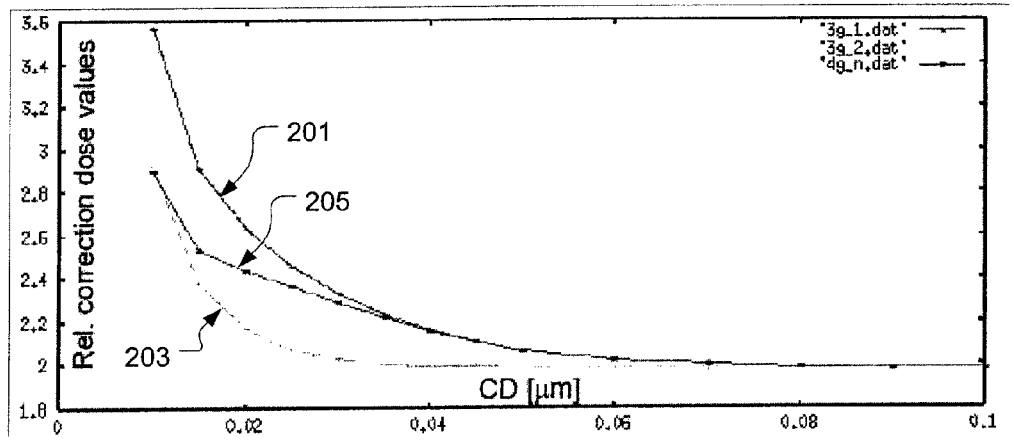
FIG. 2A is an illustration showing a chart that demonstrates the effect of using a larger number of Gaussian functions with a negative weight in the improved proximity function, in accordance with one embodiment of the present invention.

FIG. 2A is an illustration showing a chart that demonstrates the effect of using a larger number of Gaussian functions with a negative weight in the improved proximity function, in accordance with one embodiment of the present invention. The curve 201 is a dose assignment function (dose vs. CD) that corresponds to a proximity function having the following parameter values: n=3, $\sigma_1$=0.01, $k_1$=0.5, $\sigma_2$=0.04, $k_2$=0.5, $\sigma_3$=10.0, $k_3$=1.0. A second example of a dose target function is shown as curve 203. The curve 203 corresponds to a proximity function having the following parameter values: n=3, $\sigma_1$=0.01, $k_1$=0.5, $\sigma_2$=0.02, $k_2$=0.5, $\sigma_3$=10.0, $k_3$=1.0. An example of the impact of an improved proximity function is shown as curve 205. The curve 205 corresponds to an improved proximity function having the following parameter values: n=4, $\sigma_1$=0.01, $k_1$=0.9, $\sigma_2$=0.02, $k_2$=-0.4, $\sigma_3$=0.04, $k_3$=0.5, $\sigma_4$=10.0, $k_4$=1.0.

In the proximity functions associated with curves 201 and 203, the first two Gaussian functions, i.e., n=1 and n=2, are defined to model the short range electron energy deposition effects. The third Gaussian function, i.e., n=3, in curves 201 and 203, is defined to model the long range electron energy deposition effects. A $\sigma_2$ value reduction from 0.04 to 0.02 accounts for the difference between the proximity functions associated with curves 201 and 203. Based on examination of curves 201 and 203, the reduction in $\sigma_2$ value causes a delay in the dose increase as the CD value decreases. However, because curves 201 and 203 includes all positive weights, i.e., $k_1$, $k_2$, and $k_3$, the dose increase exhibited by curves 201 and 203 both follow a 1/x trend.

The proximity function corresponding to curve 205 represents a "bridge" between the proximity functions corresponding to curves 201 and 203. Examination of curve 205 reveals that as the CD decreases from large values, e.g., 100 nm, the dose increase follows the same trend as curve 201. However, when the CD reaches about 45 nm, the curve 205 departs from the trend of curve 201 and proceeds on a flatter slope toward an eventually merging with curve 203. The flatting of curve 205 to bridge between curves 201 and 203 is enabled by extension of the number of Gaussian functions, i.e., extension of (n), from three to four, and inclusion of the negative weight ($k_2$=-0.4) for the second Gaussian.

Figure 2B:
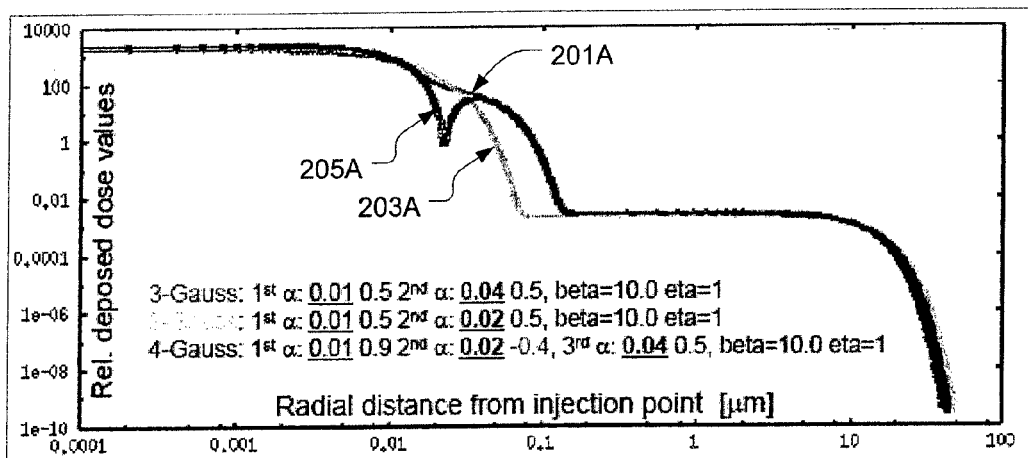
FIG. 2B is an illustration showing the example proximity functions of FIG. 2A as a function of radial distance from the electron injection point, in accordance with one embodiment of the present invention.

FIG. 2B is an illustration showing the example proximity functions of FIG. 2A as a function of radial distance from the electron injection point, in accordance with one embodiment of the present invention. Each of the proximity functions associated with curves 201, 203, and 205, in FIG. 2A correspond to the curves 201A, 203A, and 205A, respectively, in FIG. 2B. The contribution of the negative weight ($k_2$=-0.4) used for the second Gaussian in the proximity function corresponding to curve 205A can be identified as the local minimum 207 that occurs around 20 nm.

It should be understood that the proximity functions represented by curves 201A, 203A, and 205A are examples of improved proximity functions that can be defined in accordance with various embodiments of the present invention. It should be further understood that the improved proximity function of the present invention is not restricted to the example proximity functions of FIG. 2B. More specifically, depending on the complexity of the electron beam process, the values n, $\sigma_i$, and $k_i$ can be set as necessary to provide a sufficiently accurate modeling of the dose target functions. It should be appreciated that by allowing extension of the number of Gaussian functions (n) beyond two and by allowing use of both positive and negative weights ($k_i$), the improved proximity function as defined in Equation 3 provides for accurate modeling of non-linear resist process behavior.

Additional Dose Correction Functions

The improved proximity function described above can be used to model the dose response within the resist as a function of distance from the incident ebeam. Therefore, according to Equation 2, dose delivered to a given portion of a layout can be determined by convoluting the layout design with the improved proximity function. However, the proximity functions of different test classes may be different due to effects that are not included in the dose response model. Accordingly, it may be necessary to supplement the particular proximity function used in the EBPC process with additional dose correction functions that are defined to account for differences due to process effects, e.g., lower etch rates at line ends.

Iso-Dense Bias Correction

Layout feature density is one characteristic for which an additional dose correction function is defined, in accordance with one embodiment of the present invention. As the spacing decreases between features, such as lines, the density of the lines per unit area of layout increases. It should be appreciated that as the spacing between features decreases, more features will be in closer proximity to one another, such that short range proximity effects and their associated correction will be affected.

The term iso-dense bias is used to represent the difference in measured CD between an isolated line and densely packed lines. As the spacing between lines is decreased, each line will receive more dose from the writing of surrounding lines. Thus, without proper compensation, each line in an array of lines will become more overexposed as the spacing between lines decreases. Overexposure of the lines will cause an increase in the CD of the lines. Therefore, when considering an isolated line of a given design CD and an array of lines of the same design CD, without proper compensation for the iso-dense bias the actual measured CD of each line in the array of lines will be greater than that of the isolated line.

In one embodiment, the iso-dense bias is addressed by an additional dose correction function to be applied during correction of the short range proximity effects. More specifically, the residual iso-dense bias that is not captured by the dose deposition model in standard EBPC is corrected. For purposes of discussion, the additional dose correction function is termed $k_{bias}$. The $k_{bias}$ function is a CD-based function, as opposed to a density-based function. This is because a density-based function has natural limitation for dense lines. For example, an array of lines having a one-to-one ratio of line width to intervening spacing has a constant pattern density of 50%, regardless of the actual CD values of the lines. Therefore, a density-based function in this situation would always assign the same result. Experience suggests that CD variation should be considered in formulating the iso-dense bias dose correction function. Thus, the $k_{bias}$ function is a CD-based.

In developing the $k_{bias}$ function, certain considerations are taken into account. First, the pure dose information at the boundary of a feature is not sufficient to fully define the $k_{bias}$ function, as the dose at the boundary is generally constant. Therefore, in order to explicitly define the CD-based $k_{bias}$ function, it is necessary to know the dose distribution within the particular feature and within the spacing next to the particular feature. In reality, it is difficult to correlate the dose distribution within the particular feature and within the spacing next to the particular feature to the resulting CD of the feature. Therefore, the $k_{bias}$ function of the present invention is defined to provide a multiplication factor to account for next neighbor dose contribution as a function of distance to the next neighbor.

In one embodiment, $k_{bias}$ is defined as a ratio between a target dose for dense spaced lines and the dose computed by EBPC for dense lines based on a proximity function for isolated lines. The proximity function for isolated lines has to be derived from the target dose function. A target dose function for isolated lines can be determined by defining and rendering a test structure class that includes isolated lines of varying width. This test structure class enables determination of dose required to achieve each target line width. The CD, i.e., width, of each isolated line test structure is measured. The isolated line test structures that have acceptable CD measurements are identified. The required dose for a particular isolated line width is the dose that was used to render the particular isolated line width in the test structure class. The target dose function for isolated lines is defined by the required dose as a function of line width. Once the target dose function for isolated lines is determined, a proximity function for isolated lines $f_{iso\_line}(r)$ can be developed in accordance with Equation 3, by fitting to the target dose function.

A target dose function for dense spaced lines can be determined by defining and rendering a test structure class that includes arrays of lines of varying line width an varying line spacing. This test structure class enables determination of dose required to achieve each target line width for each line spacing. The CD, i.e., width, of each line in each array is measured. The lines that have acceptable CD measurements are identified for each array. The required dose for a particular line spacing and line width is the dose that was used to render the array of lines corresponding to the particular line spacing having an acceptable line CD value. The target dose function for arrays of lines is defined by the required dose as a function of both line width and line spacing. Once the target dose function for arrays of lines is determined, a proximity function for arrays of lines $f_{array\_line}(r)$ can be developed in accordance with Equation 3, by fitting to the target dose function.

Considering the foregoing, the $k_{bias}$ function can be defined as shown below in Equation 4:

$$k_{bias} = \frac{D_{array\_line}(\text{width, spacing})}{C_{array\_line}(f_{iso\_line})} \quad \text{Equation 4}$$

where $D_{array\_line}$ is the target dose for dense spaced lines, and $C_{array\_line}$ is the correction dose calculated by a $f_{iso\_line}$ for an array characterized by (width,spacing). It should be appreciated that while direct solution of $k_{bias}$ as presented in Equation 4 may be possible, such a direct solution would be rather complex. Therefore, in one embodiment of the present invention, $k_{bias}$ is represented as a three-dimensional function as shown in FIG. 3. With respect to FIG. 3, the value $\rho_s$ represents the density of the inspected line itself. As such, the value $\rho_s$ is a general equivalent to the line width of the inspected layout feature. The value $\rho_o$ represents the density of the other neighboring layout features, i.e., the layout features present around the inspected layout feature. As such, the value $\rho_o$ is a general representation of the distances and widths of the neighboring layout features.

Inspection of FIG. 3 reveals that if $\rho_o$ is low (close to zero), the inspected layout feature represents an isolated line and $k_{bias}$ equals one, i.e., there is no iso-dense bias associated with the inspected layout feature. If $\rho_o$ is increasing, the spacing between adjacent lines is decreasing, and a different (usually lower) dose should be assigned to the inspected layout feature. In the present embodiment, if $\rho_s$ becomes 0.5 (density at the edge of a "large" line), the iso-dense bias effect decreases. However, it should be understood that in other embodiments the dependence of $k_{bias}$ on $\rho_s$ may be controlled in a different manner.

It should be understood that the $k_{bias}$ function presented in FIG. 3 is one example of many different $k_{bias}$ functions that may be developed. For example, certain layout conditions may include iso-dense bias effects that behave differently from isolated versus dense lines. In such an exemplary situation, the $k_{bias}$ function may differ, as required, from that shown in FIG. 3. Also, it should be understood that in one embodiment, the $k_{bias}$ function will be evaluated experimentally at a finite number of points. The $k_{bias}$ function values intervening between the finite number of experimentally evaluated points will then be determined through an appropriate interpolation process, considering boundary conditions such as $k_{bias}$ equals one when $\rho_o$ equals zero.

In an alternate embodiment, the $k_{bias}$ function can be defined as a sum of Gaussian functions, as shown in Equation 5 below:

$$k_{bias}(x) = 1 - \left[ w_1 \exp\left(-\frac{x^2}{p_1^2}\right) + w_2 \exp\left(-\frac{x^2}{p_2^2}\right) + \ldots \right] \quad \text{Equation 5}$$

wherein (x) is the distance between lines and (w) and (p) are fitting coefficients. The $k_{bias}$ function of Equation 5 would be fit such that $k_{bias}$ equals one for (x) values greater than or equal to the short range proximity effect distance. Also, $k_{bias}$ would be expected to decrease toward the middle of the short range proximity effect distance. Additionally, depending on the resist, an increase in $k_{bias}$ may occur for the smallest measurable CD values, e.g., about 20 nm. The $k_{bias}$ of Equation 5 can be physically interpreted as follows:

For large CD values, the short range correction in the base proximity function is sufficient and $k_{bias}$ equal one, i.e., no iso-dense bias, As line spacing decreases and the dose received by each line correspondingly increases, the $k_{bias}$ value should be less than one, and As line spacing decreases to a sufficiently small amount, mechanical effects such as capillary forces during drying will act to destabilize the lines, thus required more dose for stabilization and hence a $k_{bias}$ greater than one.

Figure 4:
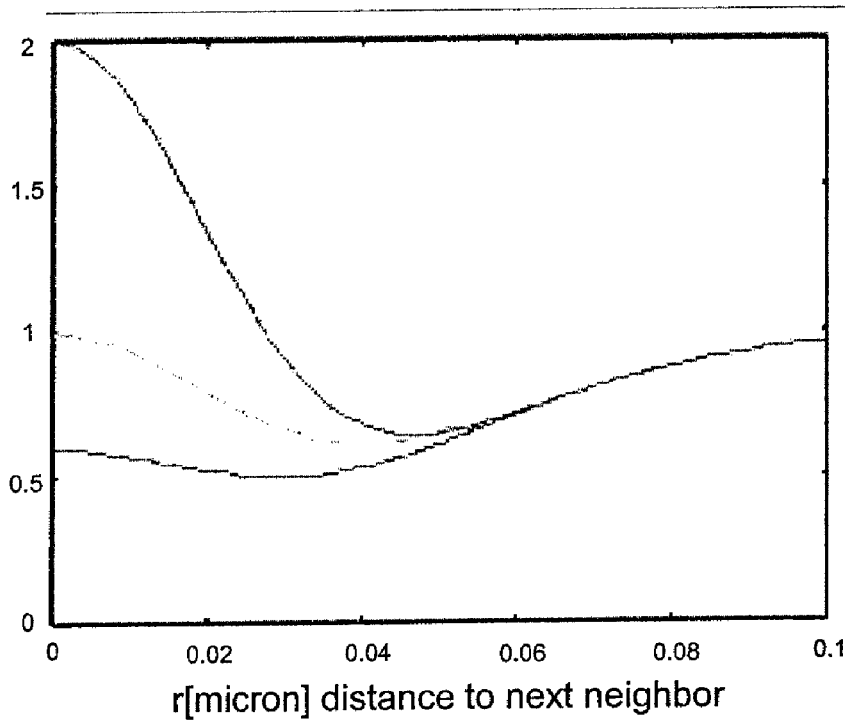
FIG. 4 is an illustration showing examples of the $k_{bias}$ function described with respect to Equation 5, in accordance with one embodiment of the present invention.

FIG. 4 is an illustration showing examples of the $k_{bias}$ function described with respect to Equation 5, in accordance with one embodiment of the present invention.

Line End Shortening Correction

In addition to layout feature density, line end shortening (LES) is another effect for which an additional dose correction function is defined, in accordance with one embodiment of the present invention. In the direct write ebeam process, if the area at the end of a line is underexposed, the length of the line ultimately rendered in the resist will be correspondingly shortened. This is called the LES effect. It should be appreciated that the LES effect can lead to serious problems in portions of the circuit design where the position of a particular line end is of importance, such as where a gate of a transistor overlaps the underlying active level.

To deal with the LES effect, the present invention implements a line end detection operation, followed by an operation for calculating an adapted dose for the detected line end. The line end detection operation is performed in conjunction with a pre-fracturing operation in which the design data, i.e., layout, is broken up into a number of portions that each require a particular deposited dose. The pre-fracturing operation is performed such that the number of resulting layout portions is minimized, while also providing for separation of sensitive parts, such as line ends, for subsequent specialized dose treatment. Once the design is pre-fractured, each line end will be able to receive a customized dose assignment.

The customized dose assigned to each line end will be based on the adapted dose calculation. In the adapted dose calculation, the dose evaluation point for the particular line end is shifted outside, i.e., beyond, the line so that the detected dose is reduced during the short range effect correction process. Because the dose detected at the shifted dose evaluation point is lower than the dose that would have been detected at the actual line end, the corresponding short range effect dose correction factor will be higher. The dose evaluation point displacement from the line end is a user defined function of the CD value of the line.

An example dose evaluation point displacement function for LES correction is shown below in Equation 6:

$$d(w) = g_1 \alpha \cdot \exp\left(-\frac{w^2}{g_2 \cdot \alpha^2}\right)$$ Equation 6 wherein (w) represents the line width, i.e., CD value of the line, ($\alpha$) is the short range effect distance, and ($k_1$) and ($k_2$) are fitting coefficients. With regard to Equation 6, the displacement d(w) should be zero for a line width greater than the short range effect distance, i.e., greater than ($\alpha$). Also, the displacement d(w) has an upper limit, as values greater than the short range effect distance ($\alpha$) are not meaningful.

Figure 5:
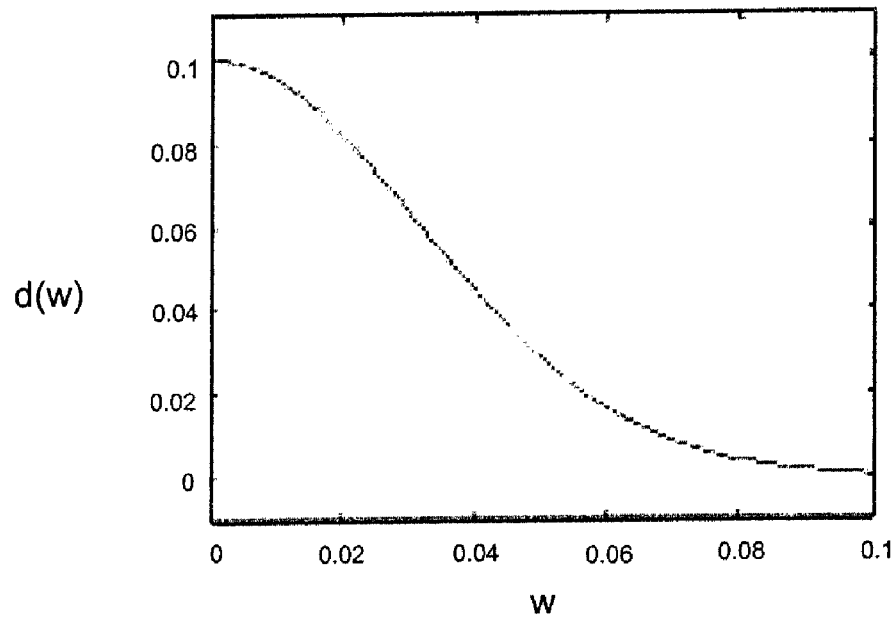
FIG. 5 is an illustration showing an example of the dose evaluation point displacement function described with respect to Equation 6, in accordance with one embodiment of the present invention.

FIG. 5 is an illustration showing an example of the dose evaluation point displacement function described with respect to Equation 6, in accordance with one embodiment of the present invention. It should be understood that the Gaussian function of Equation 6 is one of many possible function that could satisfy the boundary conditions for the dose evaluation point displacement function. For example, in another embodiment, the dose evaluation point displacement function could be defined in a pointwise manner.

Additionally, it should be appreciated that the dose evaluation point displacement function can also be used to address dose loss issues associated with ebeam writing of contact features. For example, contacts can be considered as "double line ends." Then, the dose evaluation point displacement function can be used to shift the dose evaluation point for the particular contact outside, i.e., beyond, the contact so that the detected dose is reduced during the short range effect correction process. Because the dose detected at the shifted dose evaluation point is lower than the dose that would have been detected at the actual contact location, the corresponding short range effect dose correction factor for the contact will be higher.

Figure 6:
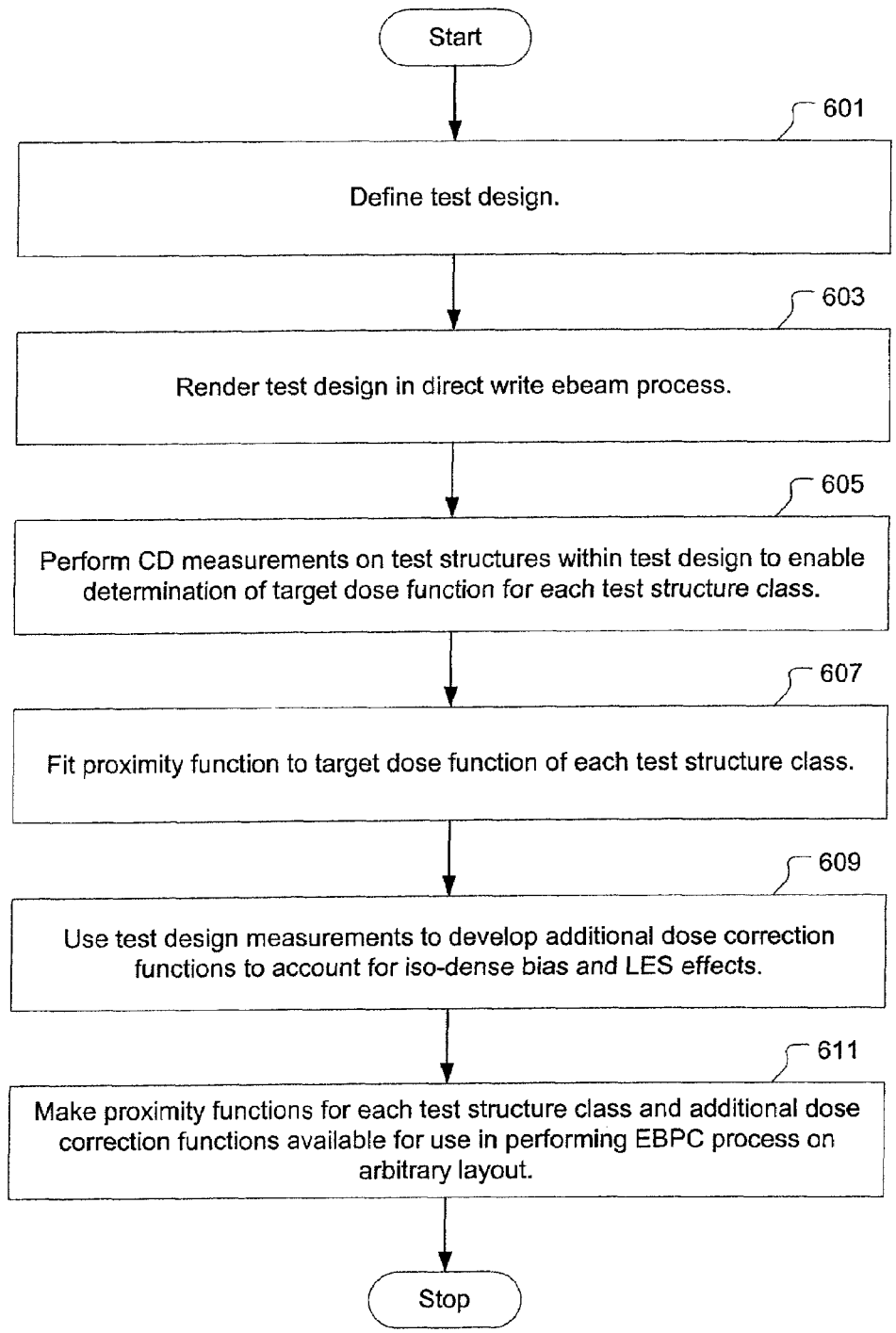
FIG. 6 is an illustration showing a flowchart of a method for calibrating the improved proximity function and additional dose correction functions, in accordance with one embodiment of the present invention.

Calibration of Improved Proximity Function and Additional Dose Correction Functions FIG. 6 is an illustration showing a flowchart of a method for calibrating the improved proximity function and additional dose correction functions, in accordance with one embodiment of the present invention. The method begins with an operation 601 for defining a test design. The test design can include a number of different test structure classes. For example, the test design can include the following test structure classes:

Isolated line test structure class: This test structure class includes isolated lines of varying target line width. This test structure class is defined to enable determination of dose required to achieve each target line width.

Isolated contact test structure class: This test structure class includes isolated contacts of varying target size. This test structure class is defined to enable determination of dose required to achieve each target contact size.

Line array test structure class: This test structure class includes arrays of lines of varying target line width and varying line spacing. This test structure class is defined to enable determination of dose required to achieve each target line width for each line spacing.

Contact array test structure class: This test structure class includes arrays of contacts of varying target contact size and varying contact spacing. This test structure class is defined to enable determination of dose required to achieve each target contact size for each contact spacing.

LES test structure class: This test structure class includes lines of varying width having their line end defined proximate to a reference feature. This test structure class is defined to enable determination of dose required to achieve a target line end position for a given line width.

It should be appreciated that the test design is not limited to the test structure classes defined above. In other embodiments, the test design can include more or less test structure classes, depending on the type of data needed for proximity function calibration and dose correction function calibration.

The method proceeds with an operation 603 for rendering the test design in a direct write ebeam process. Using a given ebeam process, the test design is written into the electron sensitive resist overlying a substrate, and the exposed resist is developed to render the patterned test design. It should be appreciated that each test structure class includes a number of instances of each test structure, wherein each instance of each test structure is written using a different dose amount. The given ebeam process is characterized by the electron energy, the ebeam configuration, i.e., ebeam equipment, the particular resist material and thickness, and the particular substrate material and thickness. Additionally, the subsequent processing (etch processing) of the exposed mask/wafer should also be considered as part of the test design rendering process. It should be appreciated that the short range proximity effects in direct ebeam writing applications is influenced to an extent by etch effects. For example, features with higher aspect ratios will tend to etch slower than more open area features.

Once the test design is rendered, the method proceeds with an operation 605 for performing CD measurements on the various test structures within the test design to enable determination of a target dose function for each test structure class. More specifically, the CD of each test structure in each test structure class is measured. The test structures having acceptable CD values are identified. The required doses are those doses that correspond to the test structure instances that have acceptable CD values. The required doses for a given test structure class are used to define a target dose function for the given test structure class. The target dose functions for the above-identified example test structure classes are defined as follows:

For the isolated line test structure class, the target dose function is defined by required dose as a function of line width.

For the isolated contact test structure class, the target dose function is defined by required dose as a function of contact size.

For the line array test structure class, the target dose function is defined by required dose as a function of both line width and line spacing.

For the contact array test structure class, the target dose function is defined by required dose as a function of both contact size and contact spacing.

For the LES test structure class, the target dose function is defined by required dose as a function of line width.

Following the operation 605, the method proceeds with an operation 607 for fitting the improved proximity function to the target dose function of each test structure class to generate a separate proximity function for each test structure class. More specifically, operation 607 includes the determination of proximity function parameters that enable the proximity function for each test structure class to most accurately model the target dose function of the test structure class. Operation 607 is performed using the improved proximity function as previously described with respect to Equation 3. In one embodiment, the number of Gaussian functions (n) is set to five in developing the proximity function for each test structure class. In this embodiment, the fitting of operation 607 involves determining the parameters $\sigma_1$ through $\sigma_5$ and $k_1$ through $k_5$ that enable the proximity function for the given test structure class to best represent the target dose function of the given test structure class.

For description purposes, the proximity functions for the above-identified example test structure classes are represented as follows:

For the isolated line test structure class, the proximity function is represented as $f_{iso\_line}(r)$, For the isolated contact test structure class, the proximity function is represented as $f_{iso\_contact}(r)$, For the line array test structure class, the proximity function is represented as $f_{array\_line}(r)$, For the contact array test structure class, the proximity function is represented as $f_{array\_contact}(r)$, and For the LES test structure class, the proximity function is represented as $f_{LES}(r)$.

It should be understood that one of the above-identified proximity functions, in combination with the additional dose correction functions, will be used in performing EBPC on a particular layout. The proximity function used for EBPC on a particular layout is called the base proximity function, $f_{base}(r)$. For example, if the particular layout to undergo EBPC is a generalized layout, the proximity function $f_{iso\_line}(r)$ may be used as $f_{base}(r)$. In another example, if the particular layout to undergo EBPC is a contact layer, the proximity function $f_{iso\_contact}(r)$ may be used as $f_{base}(r)$.

The method further includes an operation 609 for using the test design measurements to develop the additional dose correction functions to account for iso-dense bias and LES effects. With respect to the iso-dense bias, the proximity function for the isolated line test structure class, $f_{iso\_line}(r)$ and the proximity function for the line array test structure class, $f_{array\_line}(r)$, are used to develop the $k_{bias}$ function, as previously discussed. With respect to the LES effects, the dose evaluation point displacement function, d(w), as previously discussed, is defined by fitting displacement values to the target doses of the line ends, wherein the target doses of the line ends are represented by the target dose function of the LES test structure class.

The method concludes with an operation 611 in which the improved proximity functions for each test structure class and the additional dose correction functions are made available for use in performing an EBPC process on an arbitrary layout. More specifically, each of $f_{iso\_line}(r)$, $f_{iso\_contact}(r)$, $f_{array\_line}(r)$, $f_{array\_contact}(r)$, and $f_{LES}(r)$ is made available to be selected as $f_{base}(r)$ for use in the EBPC process. As previously discussed, if the layout layer to be rendered includes arbitrary feature arrangements, a likely candidate for $f_{base}(r)$ is the proximity function $f_{iso\_line}(r)$. However, if the layout layer to be rendered includes mostly arrays of lines, a likely candidate for $f_{base}(r)$ is the proximity function $f_{array\_line}(r)$. Similarly, if the layout layer to be rendered includes mostly arrays of contacts, a likely candidate for $f_{base}(r)$ is the proximity function $f_{array\_contact}(r)$. The $k_{bias}$ and d(w) functions are also made available for use in the short range portion of the EBPC process.

EBPC Utilizing Improved Proximity Function and Additional Dose Correction Functions The EBPC process is performed in two steps: 1) a short range effects correction step, and 2) a long range effects correction step. The short range effects correction step is referred to as the alpha correction, and is performed first in the EBPC process. The long range effect correction step is referred to as the beta correction, and is performed second in the EBPC process.

The improved proximity function, as previously discussed with respect to Equation 3, can be represented as the sum of an alpha proximity function and a beta proximity function, as shown below in Equation 7. During the alpha correction, the alpha proximity function ($f_\alpha(r)$) is used. During the beta correction, the beta proximity function ($f_\beta(r)$) is used. The index (m) in Equation 7 is set such that an optimum separation exists between the alpha proximity function and beta proximity function. In one embodiment, the index (m) is set such that the Gaussian functions with $\sigma_i$ less than about 200 nm are used to defined the alpha proximity function, with the balance of the Gaussian functions used to define the beta proximity function.

$$f_{base}(r) = \frac{1}{\pi \sum_{i=1}^{n} k_i} \sum_{i=1}^{n} \frac{k_i}{\sigma_i^2} \exp\left(-\frac{r^2}{\sigma_i^2}\right) \quad \text{Equation 7}$$

$$= f_\alpha(r) + f_\beta(r)$$

$$= \frac{1}{\pi \sum_{i=1}^{n} k_i} \left\{ \sum_{i=1}^{m} \frac{k_i}{\sigma_i^2} \exp\left(-\frac{r^2}{\sigma_i^2}\right) + \sum_{i=m+1}^{n} \frac{k_i}{\sigma_i^2} \exp\left(-\frac{r^2}{\sigma_i^2}\right) \right\}$$

where $$f_\alpha(r) = \frac{1}{\pi \sum_{i=1}^{n} k_i} \left\{ \sum_{i=1}^{m} \frac{k_i}{\sigma_i^2} \exp\left(-\frac{r^2}{\sigma_i^2}\right) \right\}$$

and $$f_\beta(r) = \frac{1}{\pi \sum_{i=1}^{n} k_i} \left\{ \sum_{i=m+1}^{n} \frac{k_i}{\sigma_i^2} \exp\left(-\frac{r^2}{\sigma_i^2}\right) \right\}$$

The alpha correction is performed using a "self-consistent method" for proximity effect correction. The self-consistent method includes calculation of a quantity $\epsilon$ for each pre-fractured layout portion, wherein $\epsilon(r_i)$ is a measure of the magnitude of the proximity effect at a point ($r_i$) due to the writing of a layout having (m) shapes each with area ($A_j$), as represented in Equation 8 below:

$$\varepsilon(r_i) = \sum_{J=1}^{m} n_J \int_{A_J} f_\alpha(r_{ij}) dA_J \quad \text{Equation 8}$$

wherein $r_{ij}=|r_i-r_j|$, $n_j$ is the incident electron exposure for shape J, and $f_\alpha$ is the alpha proximity function. Those skilled in the art should recognize that $\epsilon(r_i)$ defines a system of linear equations that is set up and solved to perform the alpha correction.

Figure 7:
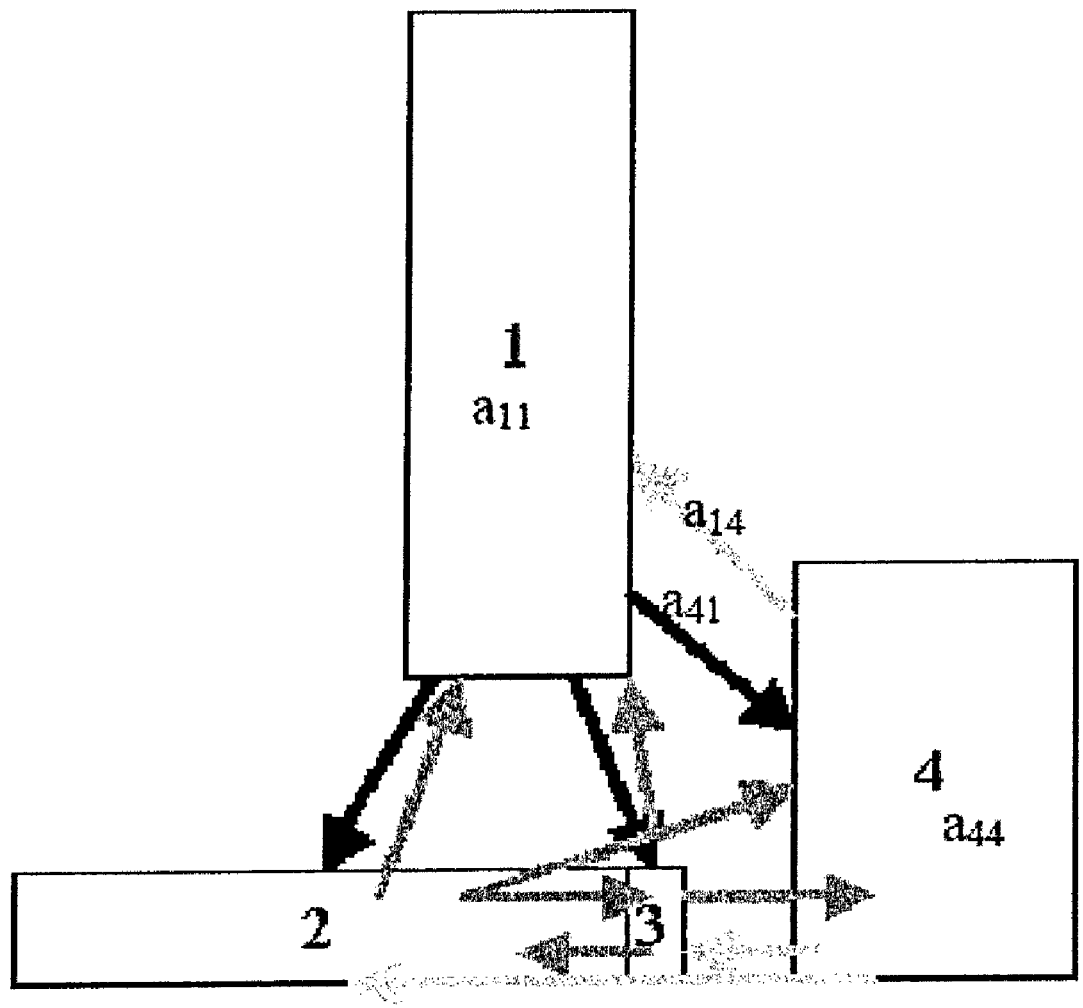
FIG. 7 is an illustration showing an exemplary layout to facilitate description of the alpha correction, in accordance with one embodiment of the present invention.

FIG. 7 is an illustration showing an exemplary layout to facilitate description of the alpha correction, in accordance with one embodiment of the present invention. The exemplary layout includes four pre-fractured layout portions labeled 1 through 4. During the alpha correction, the shape-to-shape influences are calculated by convoluting the shapes with the alpha proximity function $f_\alpha$. The result of this convolution process is a set of linear equations to be solved simultaneously, as shown in Equation 9.

$$a_{11}x_1+a_{12}x_2+a_{13}x_3+a_{14}x_4=A_1 \cdot k_{bias}1$$

$$a_{21}x_1+a_{22}x_2+a_{23}x_3+a_{24}x_4=A_2 \cdot k_{bias}2$$

$$a_{31}x_1+a_{32}x_2+a_{33}x_3+a_{34}x_4=A_3 \cdot k_{bias}3$$

$$a_{41}x_1+a_{42}x_2+a_{43}x_3+a_{44}x_4=A_4 \cdot k_{bias}4 \quad \text{Equation 9}$$

In the set of linear equations, the $a_{xx}$ coefficients are determined for specific positions within the layout, generally at feature edges. The $a_{xx}$ coefficients represent the dose correction values necessary to account for short range effects. For the line end portions of the pre-fractured layout, e.g., portion 3 in the example of FIG. 7, the $a_{xx}$ coefficients, e.g., $a_{3x}$ coefficients in the example of FIG. 7, are determined at a position shifted from the actual line end according to the dose evaluation point displacement function for LES correction, d(w), as previously discussed with respect to Equation 6. This yields the LES-corrected equation coefficients. The iso-dense bias correction is considered in the constant on the right side of each equation. More specifically, by multiplying the target dose $A_x$ by a specific $k_{bias}$, the solution for the specific feature will get a dose scaled according to the iso-dense bias effect. Incorporation of the $k_{bias}$ adjustment within the equation system ensures that each coefficient is determined consistently.

With regard to the example of FIG. 7, the coefficients represent the influence of each feature on itself and on other surrounding features. For example, the coefficient $a_{11}$ represents the convolution of feature 1 with $f_\alpha(r)$ as measured at feature 1. Thus, the coefficient $a_{11}$ represents the self influence of feature 1. Similarly, the coefficients $a_{22}$, $a_{33}$, and $a_{44}$, represent the self influence of features 2, 3, and 4, respectively. The coefficient $a_{14}$ represents the convolution of feature 4 with $f_\alpha(r)$ as measured at feature 1. Thus, the coefficient $a_{14}$ represents the influence of feature 4 on feature 1. A meaning similar to that of coefficient $a_{14}$ applies to the balance of coefficients within the set of linear equations.

With regard to the coefficients $a_{3x}$, the influences on the line end 3 are calculated in relation to a displaced evaluation point to account for LES proximity effects. The displaced evaluation point, as determined using d(w) of Equation 6, yields different $a_{3x}$ values than would otherwise be obtained without the displacement of the evaluation point. The iso-dense bias correction factor, $k_{bias}1$, is determined as a function of both $a_{11}$ (self-influence) and the sum of $a_{1i}$ for i other than 1 (other influences). The iso-dense bias correction factors, $k_{bias}2$, $k_{bias}3$, and $k_{bias}4$ are determined in a manner similar to $k_{bias}1$. For example, $k_{bias}2$ is determined as a function of both $a_{22}$ (self-influence) and the sum of $a_{2i}$ for i other than 2 (other influences).

The beta correction is performed after the alpha correction and uses the $a_{xx}$ coefficient results from the alpha correction as weighting factors in determining the dose influence of one layout region on another layout region. The beta correction is performed using a grid-based deconvolution method. The data processing in the grid-based method is performed in three stages: 1) density matrix determination, 2) deconvolution, and 3) fracturing for dosage assignment. In order to convert the layout into a form for the deconvolution, an equidistant grid is defined over the layout.

Figure 8:
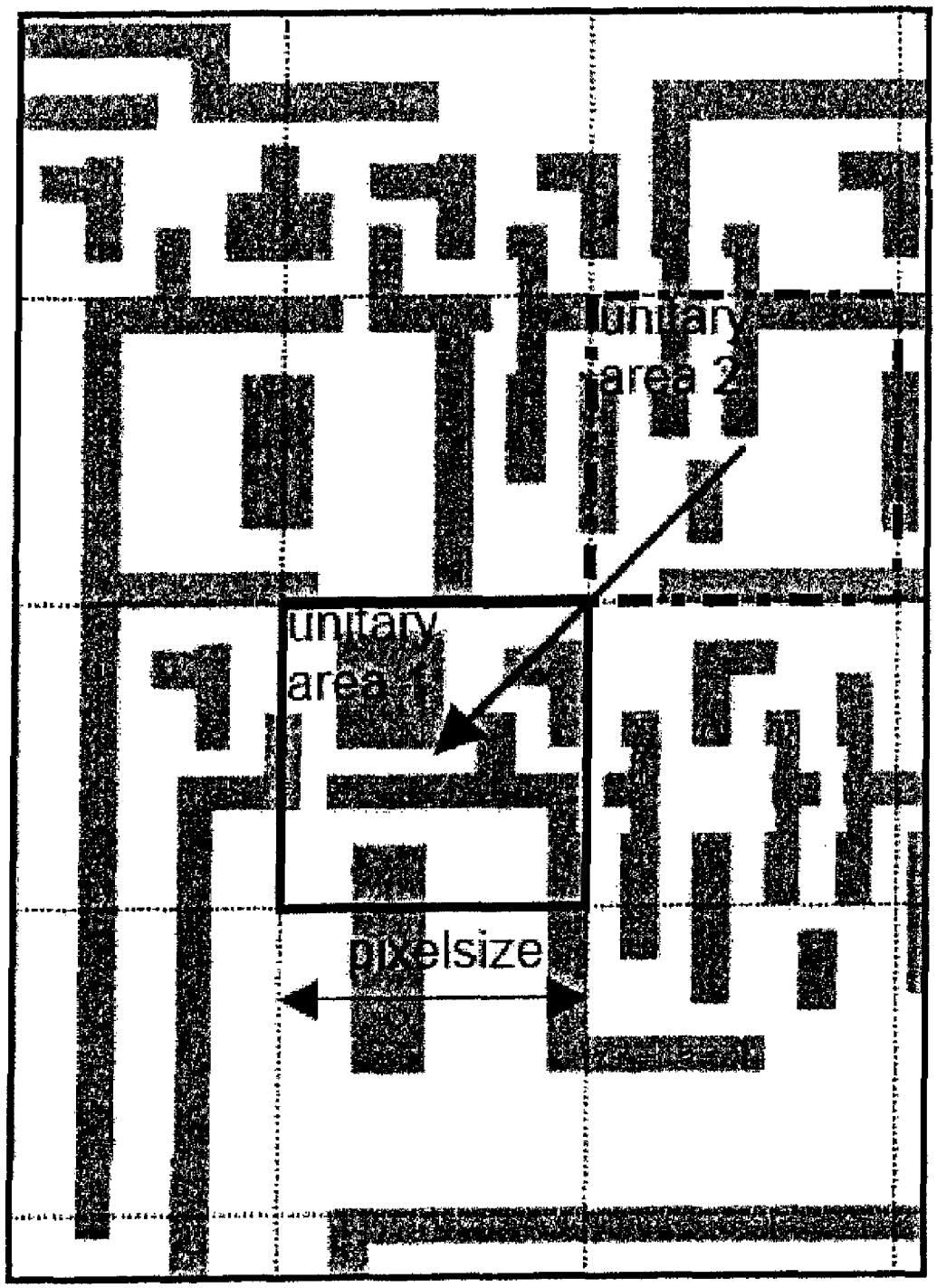
FIG. 8 is an illustration showing an example grid overlay of a layout, in accordance with one embodiment of the present invention.

FIG. 8 is an illustration showing an example grid overlay of a layout, in accordance with one embodiment of the present invention. In the grid-based method, the influences of all features within one unitary area, i.e., within one grid block, are summarized. The contribution of a given unitary area to the proximity effect observed in another unitary area depends on the weight assigned to the given unitary area. The weight assigned to a given unitary area is a function of the area covered by layout features within the given unitary area, the $a_{xx}$ coefficients assigned to the features within the given unitary area during the alpha correction, and the distance between the given unitary area and the point of interest. Those skilled in the art should appreciate that a density matrix is defined by the unitary areas within the grid overlay. Once the density matrix is determined, the density matrix is convoluted with the inverse transformed beta proximity function to determine the beta correction values.

Figure 9:
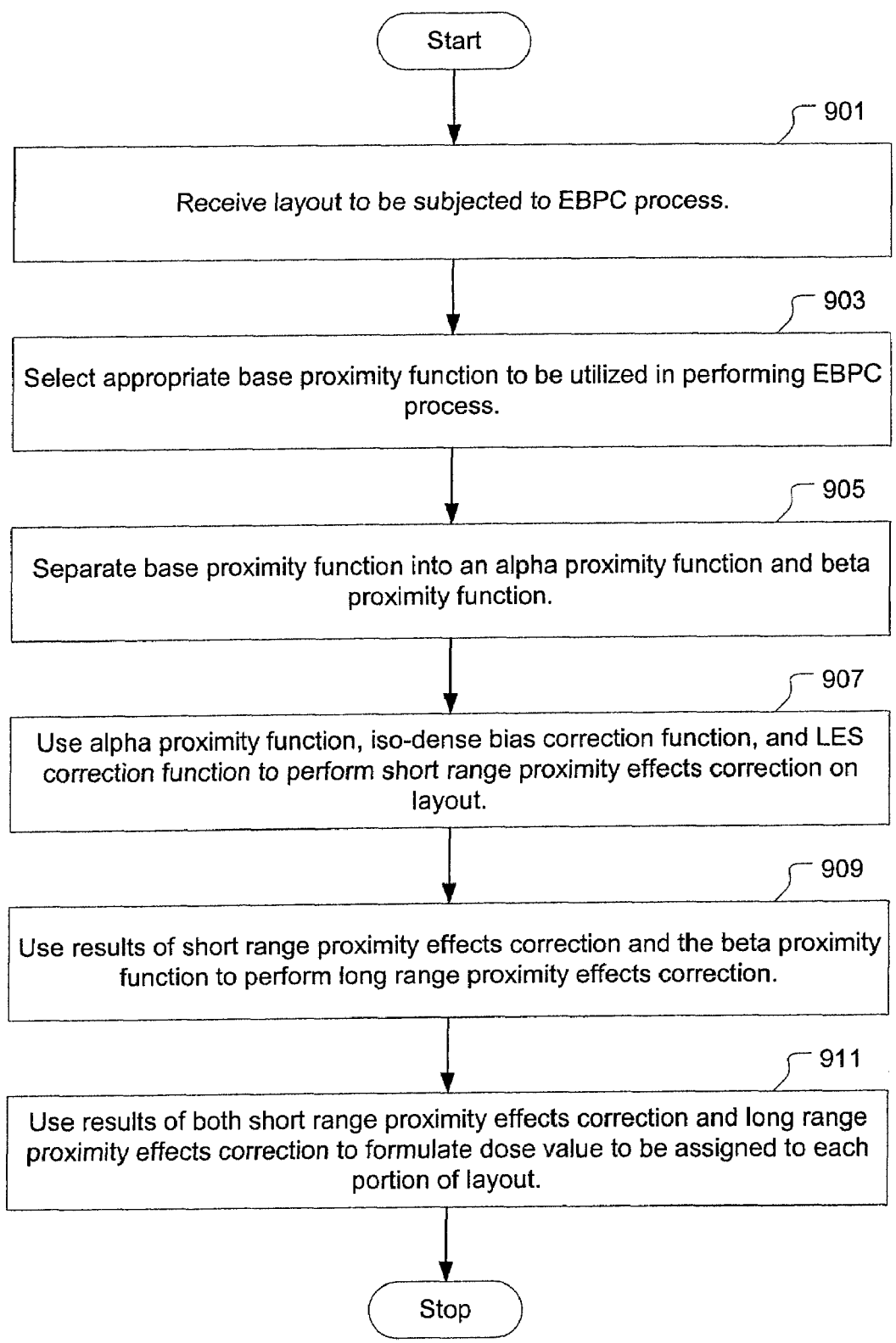
FIG. 9 is an illustration showing a flowchart of a method for utilizing the improved proximity function and additional dose correction functions to perform an EBPC process on a layout, in accordance with one embodiment of the present invention.

FIG. 9 is an illustration showing a flowchart of a method for utilizing the improved proximity function and additional dose correction functions to perform an EBPC process on a layout, in accordance with one embodiment of the present invention. The method includes an operation 901 for receiving a layout to be subjected to the EBPC process. An operation 903 is then performed to select an appropriate base proximity function, $f_{base}(r)$, to be utilized in performing the EBPC process. In an operation 905, the base proximity function, $f_{base}(r)$, is separated into an alpha proximity function, $f_\alpha(r)$, and a beta proximity function $f_\beta(r)$.

The method proceeds with an operation 907 in which the alpha proximity function, $f_\alpha(r)$, an iso-dense bias correction function, $k_{bias}$, and a LES correction function, d(w), are used to perform a short range proximity effects correction on the layout. Then, in an operation 909, a long range proximity effects correction is performed on the layout utilizing the results of the short range proximity effects correction of operation 907 and the beta proximity function, $f_\beta(r)$. In an operation 911, the results of both the short range proximity effects correction of operation 907 and the long range proximity effects correction of operation 909 are used to formulate a dose value to be assigned to each portion of the layout.

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for generating a proximity function and dose correction functions to be used in performing an electron beam proximity effect correction process, comprising:
    defining a test design including one or more test structure classes;
    rendering the test design in a direct write ebeam process;
    performing critical dimension measurements on test structures within the test design to enable determination of a target dose function for each test structure class;
    fitting a proximity function to the target dose function of each test structure class;
    using the critical dimension measurements of the test structures to develop an iso-dense bias dose correction function and a line end shortening correction function; and
    providing the proximity function of a given test structure class and the iso-dense bias dose correction function and the line end shortening correction function for use in performing a short range effects correction process.

2. A method as recited in claim 1, wherein the proximity function includes a sum of more than two Gaussian functions, wherein each Gaussian function has an associated effect range and an associated weight, wherein one or more of the associated weights is negative.

3. A method as recited in claim 1, wherein the iso-dense bias dose correction function provides a value to be multiplied by a target dose assigned to each feature within a layout during performance of a short range proximity effect correction process on the layout.

4. A method as recited in claim 1, wherein the iso-dense bias dose correction function represents a ratio of a target dose function for a dense lines test structure class to a correction dose calculated by electron beam proximity correction using a proximity function for isolated lines.

5. A method as recited in claim 1, wherein the line end shortening correction function is defined to provide a displacement distance from a line end for a dose evaluation point associated with the line end, wherein a lower dose detected at the displaced dose evaluation point causes an increase in a dose correction factor to be applied to the line end.

6. A method as recited in claim 1, wherein a line end shortening target dose function is defined to provide additional dose amounts required at line ends based on offset positions from the line ends, the additional dose amounts being translated into the line end shortening correction function though use of a base proximity function.

7. A method for performing an electron beam proximity effect correction process, comprising:
    receiving a layout;
    selecting a base proximity function that is suitable for the feature characteristics within the received layout;
    separating the selected base proximity function into an alpha proximity function and a beta proximity function;
    using the alpha proximity function and an iso-dense bias correction function, and a line end shortening correction function to perform a short range proximity effect correction on the received layout;
    using results of the short range proximity effect correction performed on the received layout and the beta proximity function to perform a long range proximity effect correction on the received layout; and
    formulating a dose value to be assigned to each feature within the received layout, wherein the dose value is formulating using the results of both the short range and long range proximity effect corrections.

8. A method as recited in claim 7, wherein the base proximity function includes a sum of more than two Gaussian functions, wherein each Gaussian function has an associated effect range and an associated weight, wherein one or more of the associated weights is negative.

9. A method as recited in claim 7, wherein the alpha proximity function represents a portion of the base proximity function defined to cover a radial distance from a point of electron beam incidence that is primarily influenced by electron dose deposited from forward scattered electrons.

10. A method as recited in claim 7, wherein the iso-dense bias dose correction function provides a value to be multiplied by a target dose assigned to each feature within the layout during performance of the short range proximity effect correction.

11. A method as recited in claim 7, wherein the line end shortening correction function is defined to provide a displacement distance from a line end for a dose evaluation point associated with the line end, wherein a lower dose detected at the displaced dose evaluation point causes an increase in a dose correction factor to be applied to the line end during the short range proximity effect correction.

12. A method for generating a proximity function to be used in performing an electron beam proximity effect correction process, comprising:
    developing a proximity function that includes a sum of more than two Gaussian functions, wherein each Gaussian function has an associated effect range and an associated weight, wherein at least one of the associated weights is negative;
    rendering a test structure class on a wafer using a direct write electron beam process;

measuring a critical dimension of features within the rendered test structure class to determine a target dose function for the test structure class; and fitting the developed proximity function to the target dose function for the test structure class, wherein the fitting generates values for both the effect range and the weight associated with each Gaussian function.

13. A method as recited in claim 12, wherein the test structure class includes isolated lines of varying target line width to enable determination of a dose required to achieve each target line width.

14. A method as recited in claim 12, wherein the test structure class includes isolated contacts of varying target size to enable determination of a dose required to achieve each target contact size.

15. A method as recited in claim 12, wherein the proximity function represents a sum of an alpha proximity function and a beta proximity function, wherein the alpha proximity function is to be used in a short range proximity effect correction and the beta proximity function is to be used in a long range proximity effect correction.

16. A method as recited in claim 15, wherein the alpha proximity function represents a portion of the base proximity function defined to cover a radial distance from a point of electron beam incidence that is primarily influenced by electron dose deposited from forward scattered electrons.

17. A method for generating an iso-dense bias correction function to be used in performing an electron beam proximity effect correction process, comprising:

rendering an isolated lines test structure class and a dense lines test structure class on a wafer using a direct write electron beam process;

measuring a critical dimension of features within the rendered test structure classes to determine a target dose function for each of the isolated lines test structure class and the dense lines test structure class; and developing an iso-dense bias correction multiplier function to represent a ratio of the target dose function for the dense lines test structure class to correction values for the dense lines test structure class, wherein the correction values are calculated using a proximity function derived from the isolated lines test structure class.

18. A method as recited in claim 17, wherein the iso-dense bias dose correction multiplier function provides a value to be multiplied by a target dose assigned to each feature within a layout during performance of a short range proximity effect correction.

19. A method as recited in claim 17, wherein the iso-dense bias dose correction multiplier function is defined as a function of feature critical dimension.

20. A method as recited in claim 17, wherein the iso-dense bias dose correction multiplier function is defined as a sum of Gaussian functions fit to model the ratio of the target dose function for the dense lines test structure class to the correction values for the dense lines test structure class.

21. A method as recited in claim 20, wherein the sum of Gaussian functions is fit such that the iso-dense bias dose correction multiplier is one for critical dimension sizes greater than or equal to the short range proximity effect distance.

* * * * *